(12) United States Patent
Peng et al.

(10) Patent No.: US 9,892,933 B2
(45) Date of Patent: *Feb. 13, 2018

(54) LITHOGRAPHY USING MULTILAYER SPACER FOR REDUCED SPACER FOOTING

(71) Applicant: Taiwan Semiconductor Manufacturing Company, Ltd., Hsin-Chu (TW)

(72) Inventors: Chao-Hsien Peng, Zhubei (TW); Hsiang-Huan Lee, Jhudong Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/878,798

(22) Filed: Oct. 8, 2015

(65) Prior Publication Data

US 2016/0027658 A1 Jan. 28, 2016

Related U.S. Application Data

(63) Continuation of application No. 14/063,453, filed on Oct. 25, 2013, now Pat. No. 9,159,579.

(51) Int. Cl.
| | |
|---|---|
| *H01L 21/311* | (2006.01) |
| *H01L 21/3065* | (2006.01) |
| *H01L 21/321* | (2006.01) |
| *H01L 21/3105* | (2006.01) |
| *H01L 21/3213* | (2006.01) |
| *H01L 21/02* | (2006.01) |
| *H01L 21/027* | (2006.01) |
| *H01L 21/033* | (2006.01) |

(52) U.S. Cl.
CPC .... *H01L 21/31116* (2013.01); *H01L 21/0234* (2013.01); *H01L 21/0276* (2013.01); *H01L 21/02186* (2013.01); *H01L 21/0332* (2013.01); *H01L 21/0337* (2013.01); *H01L 21/3065* (2013.01); *H01L 21/3105* (2013.01); *H01L 21/31111* (2013.01); *H01L 21/31133* (2013.01); *H01L 21/321* (2013.01); *H01L 21/32136* (2013.01)

(58) Field of Classification Search
CPC ............ H01L 21/0332; H01L 21/0337; H01L 21/3065; H01L 21/32136; H01L 21/32; H01L 21/0234
See application file for complete search history.

(56) References Cited

U.S. PATENT DOCUMENTS

| | | |
|---|---|---|
| 5,328,810 A | 7/1994 | Lowrey et al. |
| 6,455,389 B1 | 9/2002 | Huang et al. |
| 7,759,197 B2 * | 7/2010 | Tran .................. H01L 21/0337 257/E21.205 |

(Continued)

*Primary Examiner* — Mohsen Ahmadi
(74) *Attorney, Agent, or Firm* — Slater Matsil, LLP (57) ABSTRACT

A method embodiment for patterning a semiconductor device includes forming a plurality of mandrels over a substrate, and forming a multilayer spacer layer over the plurality of mandrels. The multilayer spacer layer is formed by conformably depositing a spacer layer over the plurality of mandrels and treating the spacer layer with plasma. The plurality of mandrels is exposed by etching a top portion of the multilayer spacer layer, thereby forming a multilayer spacer.

20 Claims, 6 Drawing Sheets (56) References Cited

U.S. PATENT DOCUMENTS

| | | | |
|---|---|---|---|
| 7,910,288 B2* | 3/2011 | Abatchev | H01L 21/0337 |
| | | | 430/313 |
| 8,623,770 B1* | 1/2014 | Gao | H01L 21/02186 |
| | | | 257/E21.236 |
| 2003/0210065 A1 | 11/2003 | Lu et al. | |
| 2004/0219743 A1* | 11/2004 | Fang | H01L 21/0332 |
| | | | 438/232 |
| 2006/0273456 A1* | 12/2006 | Sant | H01L 21/3086 |
| | | | 257/734 |
| 2007/0049011 A1* | 3/2007 | Tran | H01L 21/0337 |
| | | | 438/637 |
| 2007/0049035 A1* | 3/2007 | Tran | H01L 21/0337 |
| | | | 438/696 |
| 2007/0075385 A1* | 4/2007 | Lee | H01L 21/28282 |
| | | | 257/411 |
| 2008/0157164 A1* | 7/2008 | Hong | H01L 21/28273 |
| | | | 257/316 |
| 2009/0239382 A1* | 9/2009 | Zhu | H01L 21/0337 |
| | | | 438/696 |
| 2010/0130016 A1 | 5/2010 | DeVilliers | |
| 2011/0244694 A1 | 10/2011 | Antonelli et al. | |
| 2012/0270395 A1* | 10/2012 | Ku | H01L 21/0337 |
| | | | 438/669 |
| 2012/0280331 A1 | 11/2012 | Ou et al. | |
| 2013/0189845 A1* | 7/2013 | Kim | H01L 21/02115 |
| | | | 438/696 |
| 2013/0244437 A1 | 9/2013 | Flachowsky et al. | |
| 2014/0070296 A1 | 3/2014 | Matsuno et al. | |
| 2014/0302677 A1* | 10/2014 | Lin | H01L 29/66795 |
| | | | 438/696 |

* cited by examiner

LITHOGRAPHY USING MULTILAYER SPACER FOR REDUCED SPACER FOOTING

This application is a continuation of U.S. patent application Ser. No. 14/063,453, filed Oct. 25, 2013, entitled "Lithography using Multilayer Spacer for Reduced Spacer Footing," which application is hereby incorporated herein by reference in its entirety.

BACKGROUND

With the increasing down-scaling of semiconductor devices, various processing techniques, such as, photolithography are adapted to allow for the manufacture of devices with increasingly smaller dimensions. However, as semiconductor processes require smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

One approach used to achieve the higher resolutions to manufacture smaller devices is to use multiple pattern lithography. For example, a half pitch (i.e., half of the minimum photolithographic pitch achievable in a traditional photolithography system) can be achieved by forming mandrels (e.g., at a minimum available pitch), conformably forming a sidewall aligned spacer over the mandrels, anisotropically etching top portions of the spacer to expose the mandrels, removing the mandrels while leaving the spacer, and then using the spacer as a patterning mask to transfer the desired pattern to underlying layers. In this manner, line spacing at approximately half the minimum pitch can be achieved.

An issue with this approach is the anisotropic etching of the spacer may create spacer footing due to process limitations for uniform etching. That is, bottom portions of spacer may not be substantially perpendicular to underlying layers and may include a large fillet that extends excessively outwards in a horizontal direction. Spacer footing creates reliability issues for using the spacer as a mask to transfer a desired pattern to the underlying layer.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Various embodiments use a multilayer spacer in a multiple pattern photolithography process to reduce spacer footing and improve process reliability. A plurality of mandrels on a substrate and a multilayer sidewall aligned spacer is conformably formed over the mandrels. The multilayer spacer may be formed by conformably depositing one or more spacer layers over the mandrels and plasma treating each spacer layer after each deposition. The plasma treatment causes the spacer layers to become more compact (i.e., thinner) and easier to etch. The multilayer spacer is then anisotropically etched to expose the mandrels. Due to the plasma treatment, the anisotropic etching process may be more reliable and the issue of spacer footing may be reduced. The mandrels are then removed, and remaining portions of the multilayer spacer may be used as a mask for patterning underlying layers of the semiconductor device.

Figure 1:
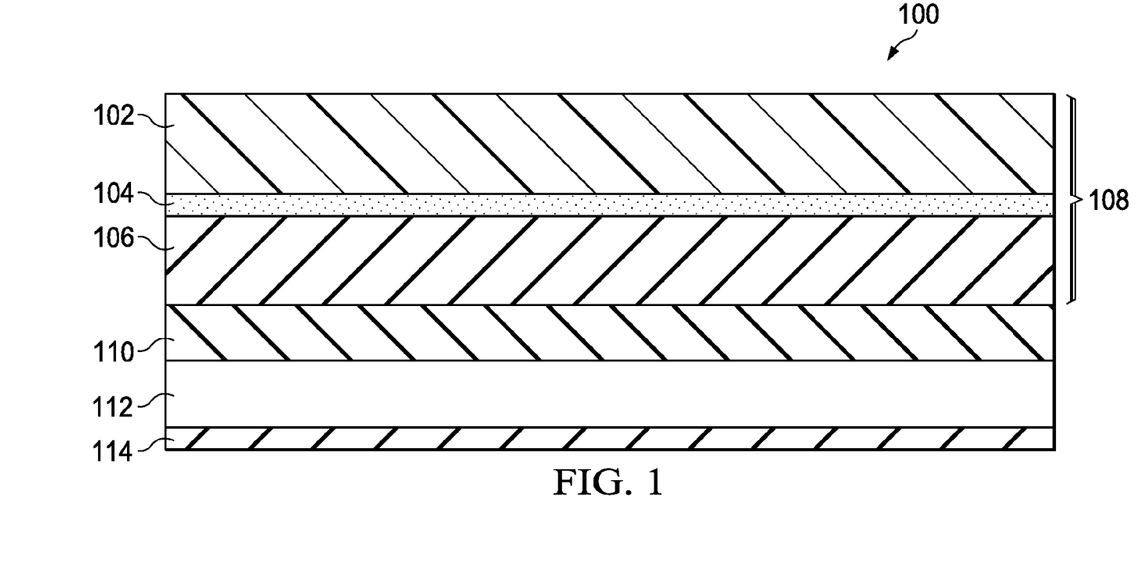
FIGS. 1-11 are cross sectional views of intermediary steps of patterning a semiconductor device in accordance with various embodiments.

FIG. 1 illustrates a semiconductor device 100 in accordance with various embodiments. Semiconductor device 100 includes a substrate 112, which may be any layer of semiconductor 100 that requires patterning. For example, substrate 112 may be a bulk substrate, a silicon-on-insulator (SOI) substrate, a dielectric layer, a polymer layer, or any other layer of semiconductor device 100 that may be patterned using photolithography and etching techniques. An etch stop layer, such as etch stop layer 114, may be optionally disposed under substrate 112. Additional layers (not shown) of semiconductor device 100 may or may not be disposed under etch stop layer 114.

A hard mask 110 is disposed over substrate 112. Hard mask 110 may be formed of any suitable material such as a nitride (e.g., silicon oxynitride or silicon nitride), a metal (e.g., titanium nitride or titanium oxide), or the like. Hard mask 110 may be formed by any suitable process such as chemical vapor deposition (CVD), low pressure CVD, plasma enhanced CVD, or the like. In subsequent process steps, a pattern is transferred onto hard mask 110 using various photolithography and etching techniques. Hard mask 110 may then be used as a patterning mask for etching underlying substrate 112.

A tri-layer photoresist 108 may be disposed over hard mask 110. Tri-layer photoresist 108 includes a top photoresist layer 102, a middle layer 104, and a bottom layer 106. As the limits of photolithography processes are reached by advanced semiconductor manufacturing processes, the need for thinner top photoresist layers has arisen to achieve smaller process windows. However, thin top photoresist layers may not be sufficiently robust to support the etching of target layers. A tri-layer photoresist 108 provides a relatively thin top photoresist layer 102 along with middle and bottom layers for more robust etching support. Middle layer 104 may include anti-reflective materials (e.g., a backside anti-reflective coating (BARC) layer) to aid in exposure and focus during the processing of top photoresist layer 102. Bottom layer 106 may comprise a hard mask material such as a nitride (e.g., silicon nitride, silicon oxynitride, or the like), a polymer, an ashable hard mask (e.g., amorphous carbon film or amorphous silicon film), polysilicon, or any other material that may be patterned and selectively removed.

In subsequent process steps, bottom layer 106 may be etched to form mandrels for the formation of a multilayer spacer. Alternatively, trilayer photoresist 108 may be used to pattern an underlying dummy layer (not shown) to form mandrels. Additionally, multiple optional layers (not shown) may be included in semiconductor device 100. For example, additional photoresist layers (not shown), such as additional middle layers and/or bottom layers, may be disposed between tri-layer photoresist 108 and hard mask 110. As another example, an antireflective layer (not shown), such as a nitrogen free antireflective layer may be disposed between hard mask 110 and substrate 112. Thus, the configuration of semiconductor device 100 illustrated in FIG. 1 may be modified as needed based on the specific photolithography process used to pattern substrate 112.

Figure 2:
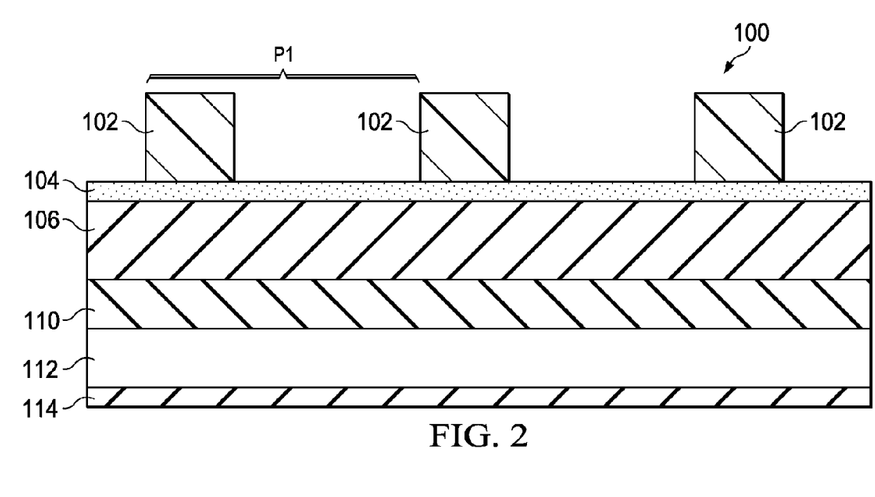

In reference now to FIG. 2, top photoresist layer 102 is patterned using any suitable photolithography technique. For example, a photomask (not shown) may be disposed over top photoresist layer 102, which may then be exposed to radiation such as ultraviolet light or an exciser laser. A bake or cure operation may be performed to harden top photoresist layer 102, and a developer may be used to remove either the exposed or unexposed portions of layer 102 depending on whether a positive or negative resist is used. Thus, a pattern such as the pattern illustrated in FIG. 2 is formed in top photoresist layer 102. The patterned portions of top photoresist layer 102 may be spaced apart from each other at a pitch P1. Pitch P1 may be a minimum pitch (i.e., the smallest pitch the photolithographic system can achieve). Top photoresist layer 102 may optionally undergo a trimming process (not shown) to reduce a width of individual elements of layer 102 as desired. The specific pattern of photoresist layer 102 shown in FIG. 2 is for illustrative sake only, and other patterns may be formed depending on the design of semiconductor device 100.

Figure 3:
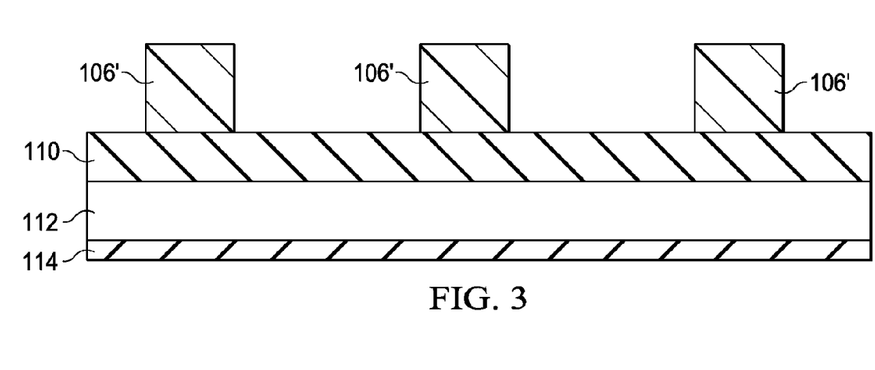

FIG. 3 illustrates the transferring of the pattern of top photoresist layer 102 to bottom layer 106 using, for example, a selective etchant process. Subsequently, top layer 102 and middle layer 104 may be removed using, for example, an ashing process in combination with a wet clean process. Top portions of bottom layer 106 may also be optionally removed by etching to achieve a desired aspect-ratio. The remaining portion of bottom layer 106 form a plurality of mandrels 106'. Alternatively, bottom layer 106 may be used to pattern mandrels in an underlying dummy layer (not shown). In such embodiments, bottom layer 106 may be removed after the formation of mandrels.

Figure 4:
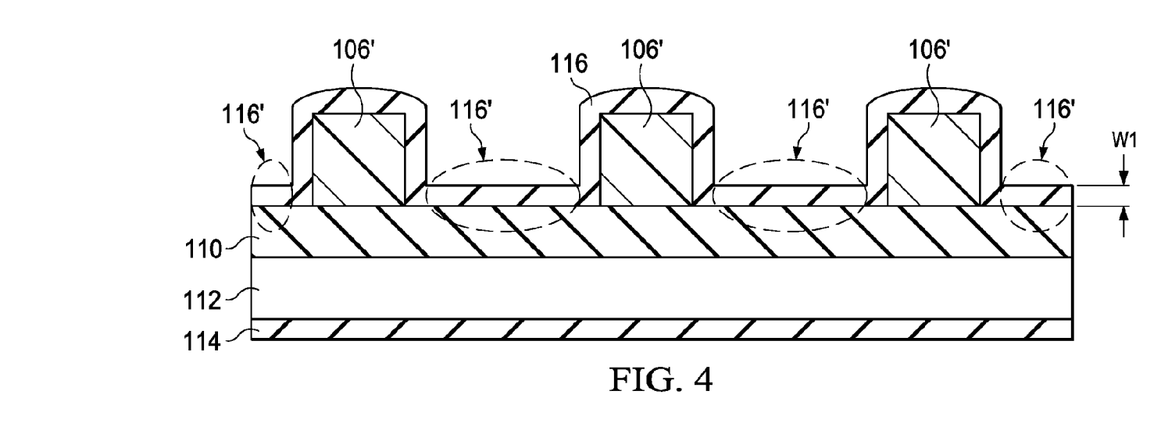

FIGS. 4-7 illustrate intermediary steps during the formation of a multilayer spacer 120 (please refer to FIG. 7) in accordance with various embodiments. FIG. 4 illustrates the conformal deposition of a first spacer layer 116 over a top surface and along sidewalls of mandrels 106'. Thus, spacer layer 116 may also be referred to as a sidewall aligned spacer layer. Spacer layer 116 further covers a top surface of the semiconductor layer immediately underlying mandrels 106' (e.g., hard mask 110 in semiconductor device 100). Spacer layer 116 may be deposited using any suitable method, such as, chemical vapor deposition (CVD), low pressure CVD, or the like, and spacer layer 116 may be formed of any suitable material so that mandrels 106' and spacer layer 116 may be selectively etched. For example, when mandrels 106' comprise a silicon nitride, spacer layer 116 may comprise titanium nitride (TiN), titanium oxide (TiO), or the like. Alternatively, when mandrels 106' comprise a hard mask material (e.g., amorphous carbon), spacer layer 116 may comprise silicon nitride, silicon oxynitride, or the like.

Spacer layer 116 has a width W1, which may be about 100 Å or less. The width of spacer layer 116 may be controlled by selecting appropriate process conditions (e.g., time and quantity of spacer material) used during the deposition process. W1 may be chosen so that planar portions of spacer layer 116 surrounding base portions of mandrels 106' (e.g., portion 116') are sufficiently thin so that these portions 116' may be effectively treated with plasma as will be explained in greater detail below.

Figure 5:
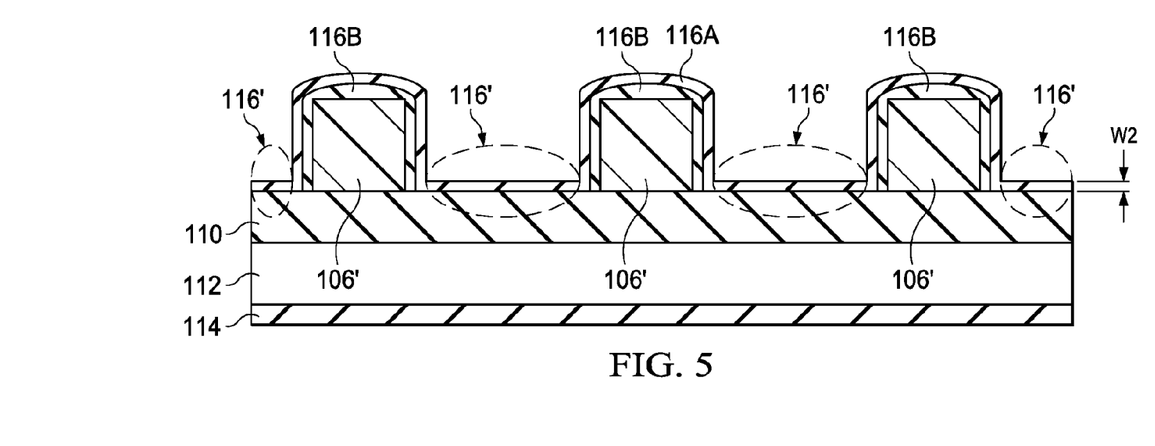

With reference now to FIG. 5, portions of spacer layer 116 are thinned, for example, by applying a plasma treatment. The plasma treatment causes spacer layer 116 to be denser (i.e., thinner) and easier to etch. Plasma treatment may be performed using any suitable process conditions. For example, a suitable process gas, such as $H_2$, $N_2$, $NH_3$, a mixture of $N_2$ and $H_2$, or the like, may be flowed over spacer layer 116 at a rate of about 500 to about 5000 standard cubic centimeters per minute (sccm). An appropriate bias power (e.g., between 300 W to about 3000 W) may be applied to the gas, for example, through the use of electrodes, microwaves, or the like. The applied bias power excites the gas particles and creates plasma ions, which may be used to penetrate and treat spacer layer 116. The plasma treatment process may be conducted in an environment having a pressure level of about 0.1 to about 10 Torr and a temperature of about 200 to about 500 degrees Celsius. One or more treatment cycles may be applied to spacer layer 116 as desired by the specific process used.

A thinned portion of spacer layer 116 modified by plasma is indicated portion 116A. As clearly illustrated in FIG. 5, other portions of spacer layer 116 (e.g., portion 116B) may be unmodified by the plasma treatment process. These unmodified portions may be a result of thicker or vertical portions of spacer layer 116, which may not be fully penetrated by plasma during the treatment process. In various embodiments, spacer layer 116 may be formed so that portion 116' has a width W1 prior to plasma treatment that is relatively thin and fully susceptible to plasma. After plasma treatment, portion 116' has a width W2 that may be about half of width W1. For example, if width W1 is about 100 Å, width W2 may be about 50 Å. Thus, portions 116' may be easier to etch in subsequent process steps.

Figure 6:
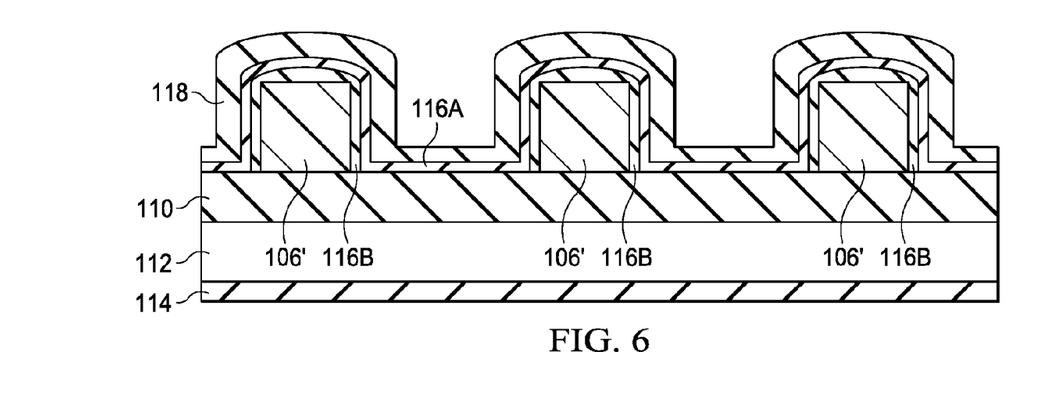

With reference now to FIG. 6, a second spacer layer 118 is conformably deposited over and covering sidewalls of spacer layer 116 and mandrels 106'. Spacer layer 118 may be substantially similar to spacer layer 116 both in composition and formation process. In FIG. 6, another plasma treatment process, which may be substantially similar to the process treatment described above with respect to FIG. 5, is applied to spacer layer 118. As a result of the plasma treatment process, at least a portion of spacer layer 118 (e.g., 118A) is thinner (i.e., more compact) and more readily etched. However, remaining portions of spacer layer 118 (e.g., 118B) may not be substantially modified because these portions were not fully penetrated by plasma. Therefore, when depositing spacer layer 118, process conditions may be controlled so that the portion of spacer layer 118 adjacent bottom portions of mandrels 106' is sufficiently thin so that the plasma treatment process may be effectively applied. For example, the thickness of these portions may be about 100 Å or less.

Figure 7:
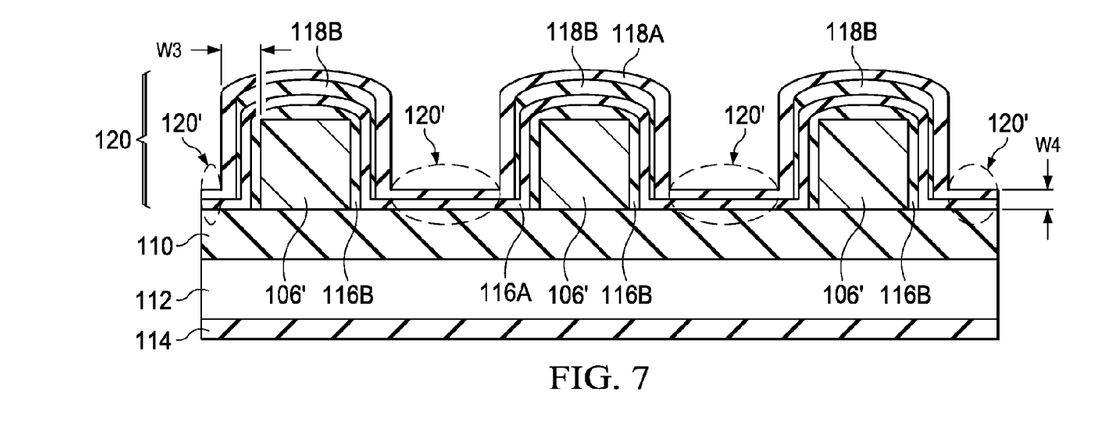

Spacer layers 116 and 118 in combination form a multilayer spacer layer 120. Multilayer spacer layer 120 has a width W3 along sidewalls of mandrels 106'. Width W3 may vary depending on layout deign and may depend on the number of spacer layers used to form multilayer spacer layer 120. If a greater width W3 is desired, additional spacer layers, for example, a third spacer layer (not shown), may be deposited over spacer layer 118 and a plasma treatment may be applied to the third spacer layer. Similarly, if a thinner width W3 is desired, spacer layer 118 may be omitted or spacer layers 116 and 118 may be formed to have a thinner width. Furthermore, multilayer spacer layer 120 has a relatively thin planar portion 120' disposed adjacent bottom portions of mandrels 106'. Planar portion 120' has a width W4, which may be less than width W3. Furthermore, as a result of the plasma treatment process, planar portion 120' is dense and easily etched.

Figure 8:
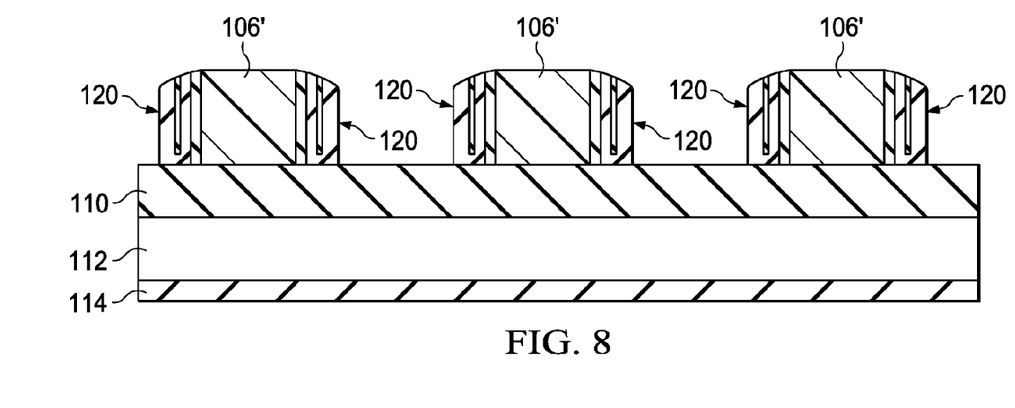

FIG. 8 illustrates the removal of a top portion of multilayer spacer layer 120 using any suitable method such as an anisotropic etching technique, thereby forming multilayer spacer 120. The etching of multilayer spacer 120 layer exposes mandrels 106' and the semiconductor device layer immediately underlying multilayer spacer 120 (i.e., hard mask 110 in semiconductor device 100). Because of the relatively thin and dense characteristics of spacer portion 120' (please refer to FIG. 7) due to the applied plasma treatments, after portion 120' is removed, sidewalls of spacer 120 may be substantially perpendicular to underlying semiconductor device layer 110. That is, spacer 120 may be substantially free of spacer footing issues.

Figure 9:
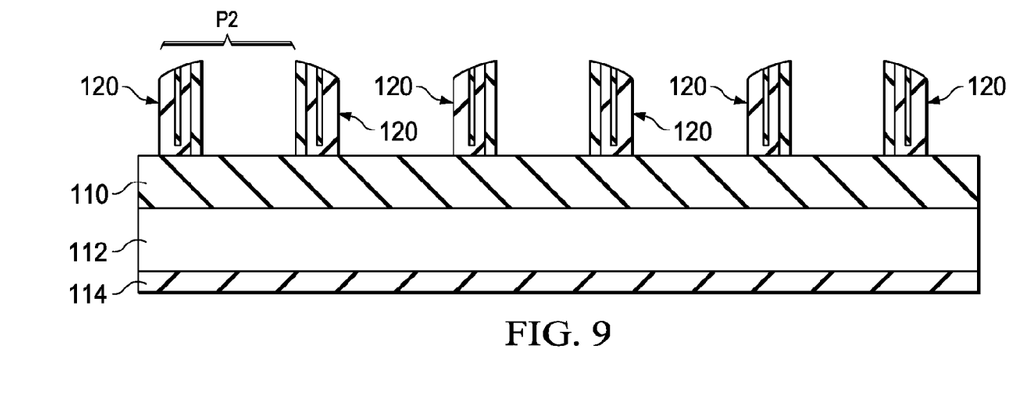

In FIG. 9, mandrels 106' may be removed without removing remaining portions of spacer 120. The removal of mandrels 106' may be done, for example, using a selective etching process such as a wet etching process using a suitable chemical etchant that removes mandrels 106' without significantly etching spacer 120. After mandrels 106' are removed, portions of spacer 120 may be spaced apart at a pitch P2, which is about half of pitch P1 (please refer to FIG. 2). For example, P2 may be about 45 nm. Thus, through the use of a mandrels and a multilayer spacer, a pattern at about half a minimum pitch may be formed.

Figure 10:
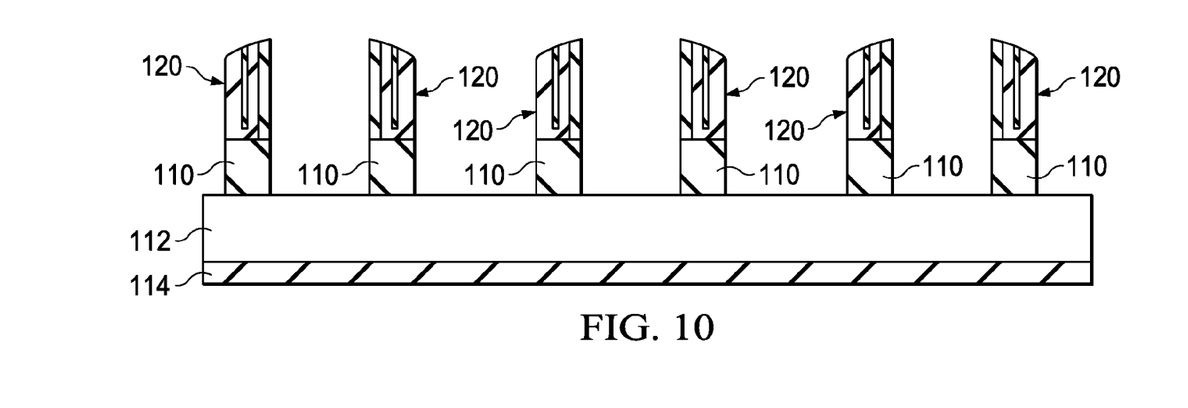
Figure 11:
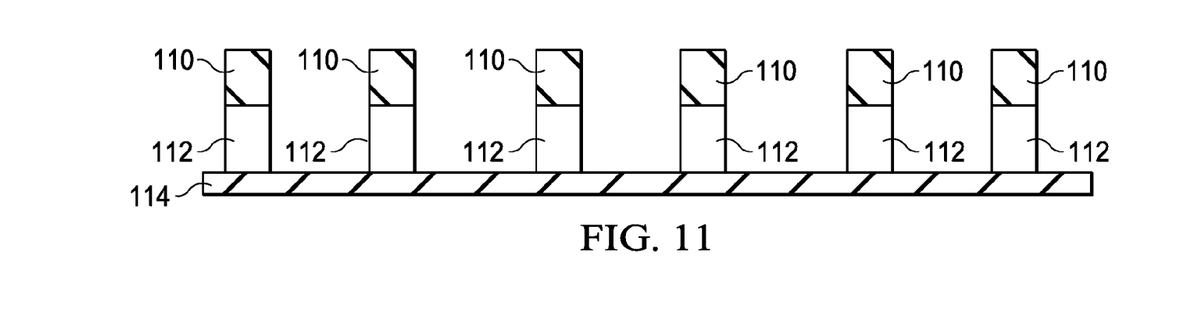

In FIG. 10, spacer 120 is used as a mask to etch hard mask 110. Because spacer 120 has substantially perpendicular sidewalls, increased reliability may be achieved in patterning hard mask 110. Subsequently, spacer 120 may be removed using a suitable process (e.g., a wet clean process). Then, in FIG. 11, hard mask 110 may be used to pattern substrate 112. Thus, through the multiple pattern lithography process described in FIGS. 1-11, reliable patterning of a substrate at about half a minimum pitch of conventional photolithography techniques may be achieved.

In accordance with an embodiment, a method for patterning a semiconductor device includes forming a plurality of mandrels over a substrate. A multilayer spacer layer is formed over the plurality of mandrels. Forming the multilayer spacer layer includes conformably depositing a first spacer layer over the plurality of mandrels and treating the first spacer layer with plasma. A top portion of the multilayer spacer layer is etched to expose the plurality of mandrels, thereby creating a multilayer spacer.

In accordance with another embodiment, a method for patterning a semiconductor device includes forming a plurality of mandrels over and contacting an underlying layer of the semiconductor device. A multilayer spacer layer is formed over the plurality of mandrels by conformably depositing one or more spacer layers over the plurality of mandrels and thinning at least a lateral portion of each of the one or more spacer layers. The plurality of mandrels and the underlying layer are exposed by removing a top portion of the multilayer spacer layer to form a multilayer spacer. The plurality of mandrels is removed, and the underlying layer is patterned using the multilayer spacer as a mask.

In accordance with yet another embodiment, a method for patterning a semiconductor device includes forming a plurality of mandrels over an underlying layer of the semiconductor device. A multilayer spacer layer is formed over the plurality of mandrels by conformably depositing a first spacer layer over the plurality of mandrels, applying a plasma treatment to the first spacer layer, conformably depositing a second spacer layer over the first spacer layer, and applying the plasma treatment to the second spacer layer with plasma. The plurality of mandrels is exposed by anisotropically etching a top portion of the multilayer spacer layer and forming a multilayer spacer. The plurality of mandrels is removed without removing the multilayer spacer, and the substrate is patterned using the multilayer spacer as a mask.

In accordance with an embodiment, a method for patterning a semiconductor device includes forming a plurality of mandrels over a substrate, depositing a first spacer layer over and extending along sidewalls of the plurality of mandrels, and treating the first spacer layer with plasma. Treating the first spacer layer with plasma reduces a first width of a lateral portion of the first spacer layer disposed between adjacent ones of the plurality of mandrels. The method further includes forming a plurality of spacers extending along sidewalls of the plurality of mandrels by removing the lateral portion of the first spacer layer after treating the first spacer layer with plasma.

In accordance with an embodiment, a method for patterning a semiconductor device includes forming a first mandrel and a second mandrel over a semiconductor device layer and forming a multilayer spacer layer over and extending along sidewalls of the first mandrel and the second mandrel. Forming the multilayer spacer layer includes depositing one or more spacer layers over and extending along sidewalls of the first mandrel and the second mandrel and increasing a density of a portion of each of the one or more spacer layers disposed between the first mandrel and the second mandrel. The method also includes removing a top portion of the multilayer spacer layer to form multilayer spacers on sidewalls of the first mandrel and the second mandrel. The method also includes removing the first mandrel and the second mandrel and patterning the semiconductor device layer using the multilayer spacers as a mask.

In accordance with an embodiment, a method for patterning a semiconductor device includes forming a mandrel over a substrate, depositing a first spacer layer over and extending along sidewalls of the mandrel, and applying a plasma treatment to increase a density of at least a portion of the first spacer layer. After applying the plasma treatment to increase the density of at least the portion of the first spacer layer, the method further includes etching the first spacer layer to expose the mandrel and form first spacers along sidewalls of the mandrel; removing the mandrel using an etching process that etches the mandrel at a faster rate than the first spacers; and using the first spacers to pattern the substrate.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for patterning a semiconductor device comprising:
   forming a first mandrel and a second mandrel over a semiconductor device layer;

forming a multilayer spacer layer over and extending along sidewalls of the first mandrel and the second mandrel by:
  depositing a plurality of spacer layers over and extending along sidewalls of the first mandrel and the second mandrel; and
  increasing a density of a portion of each of the plurality of spacer layers disposed between the first mandrel and the second mandrel, wherein after increasing the density of each of the plurality of spacer layers, each of the plurality of spacer layers remain disposed directly over a top surface of the first mandrel;
removing a top portion of the multilayer spacer layer to form multilayer spacers on sidewalls of the first mandrel and the second mandrel;
removing the first mandrel and the second mandrel; and
patterning the semiconductor device layer using the multilayer spacers as a mask.

2. The method of claim 1, wherein increasing the density of the portion of each of the plurality of spacer layers comprises a plasma treatment process.

3. The method of claim 2, wherein depositing the plurality of spacer layers comprises selecting a thickness of at least one of the plurality of spacer layers in accordance with the plasma treatment process.

4. The method of claim 2 wherein the plasma treatment process comprises using $H_2$, $N_2$, $NH_3$, or a combination thereof as a process gas.

5. The method of claim 1, wherein increasing the density of the portion of each of the plurality of spacer layers comprises thinning the portion of each of the plurality of spacer layers.

6. A method for patterning a semiconductor device comprising:
  forming a mandrel over a substrate;
  depositing a first spacer layer over and extending along a top surface and sidewalls of the mandrel;
  applying a plasma treatment to increase a density of at least a portion of the first spacer layer, wherein after applying the plasma treatment, the first spacer layer extends continuously from the top surface and sidewalls of the mandrel to a top surface and sidewalls of a second mandrel adjacent to the mandrel;
  after applying the plasma treatment, etching the first spacer layer to expose the top surface of the mandrel and the second mandrel and form first spacers along sidewalls of the mandrel and the second mandrel;
  removing the mandrel and the second mandrel using an etching process that etches the mandrel and the second mandrel at a faster rate than the first spacers; and
  using the first spacers to pattern the substrate.

7. The method of claim 6 further comprising:
  after applying the plasma treatment to the first spacer layer, forming a second spacer layer over the first spacer layer; and
  applying a plasma treatment to increase a density of the second spacer layer.

8. The method of claim 6, wherein applying the plasma treatment further thins the first spacer layer.

9. The method of claim 6, wherein forming the mandrel comprises patterning a multi-layer photoresist, wherein the multi-layer photoresist comprises:
  a photoresist layer; and
  a hard mask layer under the photoresist layer, wherein a patterned portion of the hard mask layer is the mandrel.

10. A method for patterning a semiconductor device comprising:
  forming a plurality of mandrels over a substrate;
  depositing a first spacer layer over and extending along sidewalls of the plurality of mandrels, wherein the first spacer layer comprises:
    a first sidewall portion extending along a first sidewall of the plurality of mandrels;
    a second sidewall portion extending along a second sidewall of the plurality of mandrels; and
    a lateral portion connecting the first sidewall portion to the second sidewall portion;
  treating the first spacer layer with plasma, wherein treating the first spacer layer with plasma increases a density of the lateral portion of the first spacer layer; and
  after treating the first spacer layer with plasma, forming a plurality of spacers extending along sidewalls of the plurality of mandrels, wherein forming the plurality of spacers comprises removing the lateral portion of the first spacer layer.

11. The method of claim 10 further comprising, after forming the plurality of spacers:
  removing the plurality of mandrels; and
  using the plurality of spacers to pattern to substrate.

12. The method of claim 10 further comprising:
  after treating the first spacer layer with plasma, depositing a second spacer layer over the first spacer layer; and
  treating the second spacer layer with plasma, wherein forming the plurality of spacers further comprises removing a lateral portion of the second spacer layer after treating the second spacer layer with plasma.

13. The method of claim 10, wherein treating the first spacer layer with plasma reduces a first width of the lateral portion of the first spacer layer disposed between adjacent ones of the plurality of mandrels.

14. The method of claim 13, wherein the depositing the first spacer layer comprises depositing the first spacer layer to have a second width on a sidewall of the plurality of mandrels substantially equal to the first width of the lateral portion of the first spacer layer, and wherein after treating the first spacer layer with plasma, the first width is less than the second width.

15. The method of claim 10, wherein the treating the first spacer layer with plasma comprises using $H_2$, $N_2$, $NH_3$, or a combination thereof as a process gas.

16. The method of claim 10, wherein the treating the first spacer layer with plasma comprises treating the first spacer layer with plasma at a temperature of about 200 degrees Celsius to about 500 degrees Celsius.

17. The method of claim 10, wherein the treating the first spacer layer with plasma comprises flowing a process gas over the first spacer layer at a rate of about 500 standard cubic centimeters per minute (sccm) to about 5000 sscm.

18. The method of claim 10, wherein the treating the first spacer layer with plasma comprises applying a bias power of about 300 watts to about 3000 watts.

19. The method of claim 10, wherein the treating the first spacer layer with plasma comprises treating the first spacer layer with plasma at a pressure of about 0.1 Torr to about 10 Torr.

20. The method of claim 10, wherein the first spacer layer comprises titanium nitride, titanium oxide, or a combination thereof when the plurality of mandrels comprises a nitride, and wherein the first spacer layer comprises silicon nitride, silicon oxynitride, or a combination thereof when the plurality of mandrels comprises amorphous carbon.

* * * * *